(12) United States Patent
Bisplinghoff et al.

(10) Patent No.: US 11,483,076 B2
(45) Date of Patent: Oct. 25, 2022

(54) QUADRATURE AMPLITUDE MODULATION WITH CONSTELLATION SHAPING

(71) Applicant: Cisco Technology, Inc., San Jose, CA (US)

(72) Inventors: Andreas Bernhard Bisplinghoff, Forchheim (DE); Stefan Helmut Müller-Weinfurtner, Nuremberg (DE)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/374,380

(22) Filed: Jul. 13, 2021

(65) Prior Publication Data
US 2022/0045765 A1    Feb. 10, 2022

(30) Foreign Application Priority Data
Aug. 6, 2020 (GB) .................................. 2012278

(51) Int. Cl.
| | | |
|---|---|---|
| H04L 5/12 | (2006.01) | |
| H04B 10/54 | (2013.01) | |
| H04L 27/36 | (2006.01) | |
| H04L 1/00 | (2006.01) | |
| H03M 13/41 | (2006.01) | |

(52) U.S. Cl.
CPC .......... *H04B 10/541* (2013.01); *H03M 13/41* (2013.01); *H04L 1/006* (2013.01); *H04L 27/362* (2013.01); *H04L 27/366* (2013.01)

(58) Field of Classification Search
CPC .......................... H04B 10/541; H03M 13/41; H03M 13/4107; H03M 13/4161; H03M 13/1515; H03M 13/2933; H03M 13/256; H04L 1/006; H04L 27/362; H04L 27/366; H04L 1/0043; H04L 1/0052; H04L 1/0059; H04L 27/3405; H04L 27/3411; H04L 25/03203
USPC ......................................................... 375/265
See application file for complete search history.

(56) References Cited

U.S. PATENT DOCUMENTS

| 4,586,182 A | * | 4/1986 | Gallager | ............. | H04L 27/3438 |
| | | | | | 375/241 |
| 5,150,381 A | * | 9/1992 | Forney, Jr. | .......... | H04L 27/3422 |
| | | | | | 714/795 |
| 5,159,610 A | * | 10/1992 | Eyuboglu | ........... | H04L 27/3422 |
| | | | | | 714/792 |
| 5,559,561 A | * | 9/1996 | Wei | .................... | H04N 21/2383 |
| | | | | | 375/296 |

(Continued)

OTHER PUBLICATIONS

Combined Search and Examination Report for Corresponding Application No. GB2012278.4, Jan. 21, 2021, 5 pages.

(Continued)

*Primary Examiner* — Don N Vo
(74) *Attorney, Agent, or Firm* — Edell, Shapiro & Finnan, LLC

(57) ABSTRACT

Techniques are presented for mapping a digital data sequence into a signal point sequence for transmission. The signal point sequence belongs to a set of possible signal point sequences. In one example, a digital data sequence is received. Forbidden branch flags that forbid certain signal points in the possible signal points sequences are applied. The signal point sequence is selected from a subset of all the possible signal point sequences based on the digital data sequence. The subset is defined by the forbidden branch flags.

20 Claims, 7 Drawing Sheets

(56) References Cited

U.S. PATENT DOCUMENTS

| | | |
|---|---|---|
| 5,774,500 A | 6/1998 | Zogakis et al. |
| 8,995,573 B1 | 3/2015 | Aharony et al. |
| 2005/0074068 A1 | 4/2005 | Borran et al. |
| 2006/0092050 A1 | 5/2006 | Djokovic et al. |

OTHER PUBLICATIONS

Makoto Tanahashi et al., "Trellis Shaping for Controlling Envelope of Single-Carrier High-Order QAM Signals", IEEE Journal of Selected Topics in Signal Processing, vol. 3, No. 3, Jun. 2009, 8 pages.
G. David Forney, Jr., "Trellis Shaping", IEEE Transactions on Information Theory, vol. 38, No. 2, Mar. 1992, 20 pages.

\* cited by examiner

QUADRATURE AMPLITUDE MODULATION WITH CONSTELLATION SHAPING

CROSS REFERENCE TO RELATED APPLICATION

This application claims priority to United Kingdom Application No. 2012278.4, filed Aug. 6, 2020, the entirety of which is incorporated herein by reference.

TECHNICAL FIELD

The present disclosure relates generally to digital communications, and more particularly to higher order modulations used in high-speed digital communication systems.

BACKGROUND

Modern optical communications systems now routinely employ coherent detection and digital signal processing in the transmission of data along optical signal paths between transmission and receiver devices. In such systems, information is encoded into the modulated amplitude, phase, and polarization of an optical signal, achieving very high optical channel capacity compared with systems using, for example, on-off keying only.

BRIEF DESCRIPTION OF THE FIGURES

Examples of the present disclosure will now be explained with reference to the accompanying figures.

DESCRIPTION OF EXAMPLE EMBODIMENTS

Overview

Figure 1:
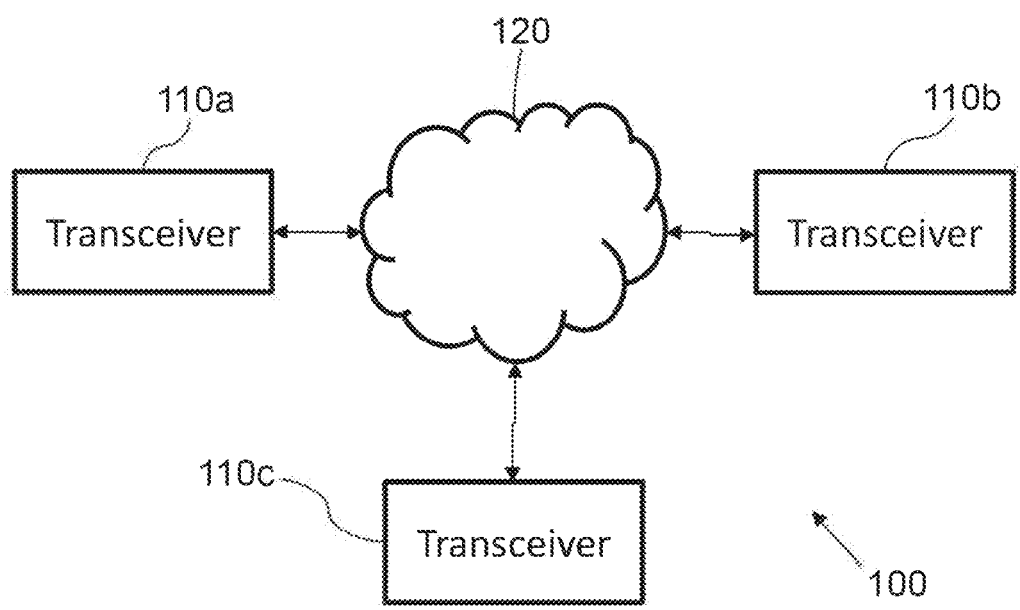
FIG. 1 is a block diagram of an example of a communication system in which the embodiments presented herein may be used.

There is provided a method for mapping a digital data sequence into a signal point sequence for transmission, said signal point sequence belonging to a set of possible signal point sequences, the method comprising: receiving said digital data sequence; applying forbidden branch flags that forbid certain signal points in said set of possible signal points sequences; and selecting said signal point sequence from a subset of said set of possible signal point sequences based on said digital data sequence, said subset being defined by said forbidden branch flags.

There is also provided apparatus for transmitting digital data sequences via a channel, the apparatus comprising: a transmitter configured to map a digital data sequence into a signal point sequence for transmission, said signal point sequence belonging to a set of possible signal point sequences, the transmitter being configured to: receive said digital data sequence; apply forbidden branch flags that forbid certain signal points in said set of possible signal points sequences; and select said signal point sequence from a subset of said set of possible signal point sequences based on said digital data sequence, said subset being defined by said forbidden branch flags.

There is also provided a non-transitory computer-readable medium comprising instructions for mapping a digital data sequence into a signal point sequence for transmission, said signal point sequence belonging to a set of possible signal point sequences, wherein the instructions, when executed by a computer, cause the computer to: receive said digital data sequence; apply forbidden branch flags that forbid certain signal points in said set of possible signal point sequences; and select said signal point sequence from a subset of said set of possible signal point sequences based on said digital data sequence, said subset being defined by said forbidden branch flags.

EXAMPLE EMBODIMENTS

In digital communication systems, a variety of digital modulation schemes may be employed for the transfer of digital information. Quadrature amplitude modulation (QAM) is a modulation method in which the optical waveform transmitted through an optical channel comprises a combination of phase-shift keying (PSK) and amplitude-shift keying (ASK). In QAM, optical signals may comprise an in-phase (I) component and a quadrature-phase (Q) component, which include the complex plane in which QAM operates, in each polarization X and Y. Higher order QAM modulation schemes (e.g. 64 QAM, 128 QAM or 256 QAM) are becoming increasingly common as signal processing becomes more efficient and data rates increase. However, the faster data rates and increased spectral efficiency provided by the higher order modulation techniques are by their nature more susceptible to noise and interference.

Digital modulations are generally susceptible to noise and other signal impairments introduced by the communication channel. Optical signals become distorted during their transmission along an optical signal path. In the case of optical fibres, imperfections in the surface of the fibre, or asymmetries in the cross-section of the fibre will cause distortion. Different path lengths inside the fibre will cause time-related distortion effects. Multiple digital modulations are employed in a variety of digital communication systems, e.g., in data traffic generally, digital subscriber links (DSLs), router systems, and a wide variety of wireless systems.

To cope with different channel conditions, some high-speed digital communication systems use a multitude of digital modulations, e.g., QPSK, 16 QAM, 32 QAM, 64 QAM, 128 QAM, 256 QAM etc., and different levels of coding and transmit power. While one channel may support a lower order modulation, e.g., QPSK, permitting only a lower data rate, another channel may support a higher order modulation, e.g., 64 QAM, providing higher data rate. Coding schemes may include forward error correction (FEC) coding such as Reed-Solomon coding and inner channel coding such as convolutional coding, trellis coded modulation, or Turbo Coding, etc.

The particular manner in which higher order constellations are constructed and the way in which coding is employed and bits are mapped onto modulation symbols represents an important topic in designing communication systems.

Advanced coherent communication systems modulate the digital data signal with high-order constellations such as 64 QAM or larger. Reception reliability is limited by random noise. Since this noise is usually additive following a Gaussian distribution, information theory then says that for maximum mutual information when transmitting across such a channel at given average transmit power, the transmit-signal distribution shall also approach a Gaussian shape. The performance gap between non-optimum transmission with uniform QAM signal points and an optimally adapted Gaussian transmit signal is up to 1.53 dB for large constellations. For this reason, a uniform QAM requires higher average transmit power.

A known technique to bridge this gap is Trellis Shaping as described in the article "Trellis Shaping" by G. David Forney in IEEE Transactions on Information Theory, Vol. 38, No. 2, March 1992, pages 281-300. Trellis shaping is a method of selecting a minimum-weight sequence from an equivalence class of possible transmitted sequences by a search through the trellis diagram of a shaping convolutional code. As discussed in Forney, a suitable algorithm/process (e.g. the Viterbi algorithm/process) searches through a trellis diagram for the shaping convolutional code C, using appropriate branch metrics.

FIG. 1 is a system diagram illustrating a communication system 100 that is constructed according to/operating according to the present disclosure. The communication system 100 includes a plurality of transceiver devices (three of which are shown as 110*a*, 110*b*, and 110*c*, collectively transceiver devices 110). Each of the transceiver devices 110*a*-110*c* communicatively couples to a network 120 that facilitates communications between the transceiver devices. While the network 120 is shown as a single entity, it is understood that the network 120 includes a plurality of elements including signal paths e.g. optical fibre, routers, splitters, couplers, relays, and amplifiers, for example. The transceiver devices 110 may comprise modem (modulate-demodulate) devices.

The network 120 supports communications between the transceiver devices 110*a*-110*c*. A transceiver device 110*a*-110*c* may provide a number of services including audio, video, local access channels, as well as any other service known in the art. Each of these services is provided to one or more users corresponding to transceiver devices 110*a*-110*c*.

A service provider employs a transceiver device 110*c* to provide network access services to the transceiver devices 110*a*-110*b*, e.g., to allow the users to access the Internet, Wide Area Networks, and other data services. A transceiver device 110*c* may receive incoming traffic from the transceiver devices 110*a*-110*b* and route it to an Internet Service Provider (ISP) for coupling to the Internet. At the transceiver device 110*c*, the service provider may also include a number of resources for providing third-party ISP access, accounting and logging purposes, dynamic host configuration protocol (DHCP) assignment and administration, the storage of Internet protocol (IP) addresses for the transceiver devices 110*a*-110*b*, and server control.

Downstream information flows to the transceiver devices 110*a*-110*b* from the transceiver device 110*c*. Upstream information flows from the transceiver devices 110*a*-110*b* to the transceiver device 110*c*. In a typical installation, the transceiver device 110*c* services as many as 1,000 transceiver devices 110*a*-110*b* on a single 75 GHz bandwidth channel. A single channel having a bandwidth of 75 GHz is capable of line rates of 600 Gbit per second of total throughput.

Figure 2A:
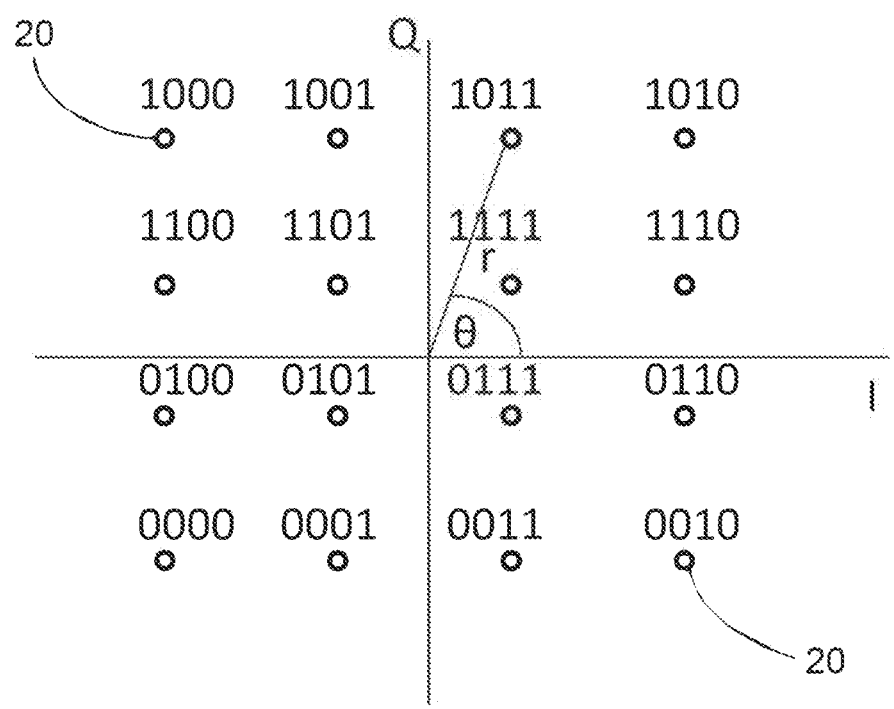
FIG. 2A is a diagram illustrating the complex plane with signal points associated with Quadrature Amplitude Modulation (QAM) in connection with which the techniques presented herein may be used.

FIG. 2A is a diagram illustrating Quadrature Amplitude Modulation (QAM). In QAM a received digital data sequence is mapped into a signal point sequence or a symbol sequence (e.g. symbol X, symbol Y, symbol Z). For ease, 16 QAM is illustrated. 16 QAM is illustrated as a square 4×4 constellation, with each point 20 in the constellation representing a symbol (e.g. a symbol representing binary label 1000, 1011, 0010 etc.). Similarly 64 QAM may use a square 8×8 constellation and 256 QAM may use a square 16×16 constellation. Each symbol can be denoted by a phase $\theta$ and an amplitude r. 16 QAM has four bits per symbol, so to encode for example a received digital data sequence of 12 bits, the 12 bits are broken into three groups of four bit, and each group may be encoded by one QAM symbol, thereby only using 3 symbols and the received digital data sequence of 12 bits is mapped into a 3 signal point sequence or symbol sequence. 64 QAM has six bits per symbol, so to encode 12 bits, the 12-bit string is divided into two groups of six, thereby only using two symbols, and the received digital data sequence of 12 bits is mapped into a 2 signal point sequence or symbol sequence.

Figure 2B:
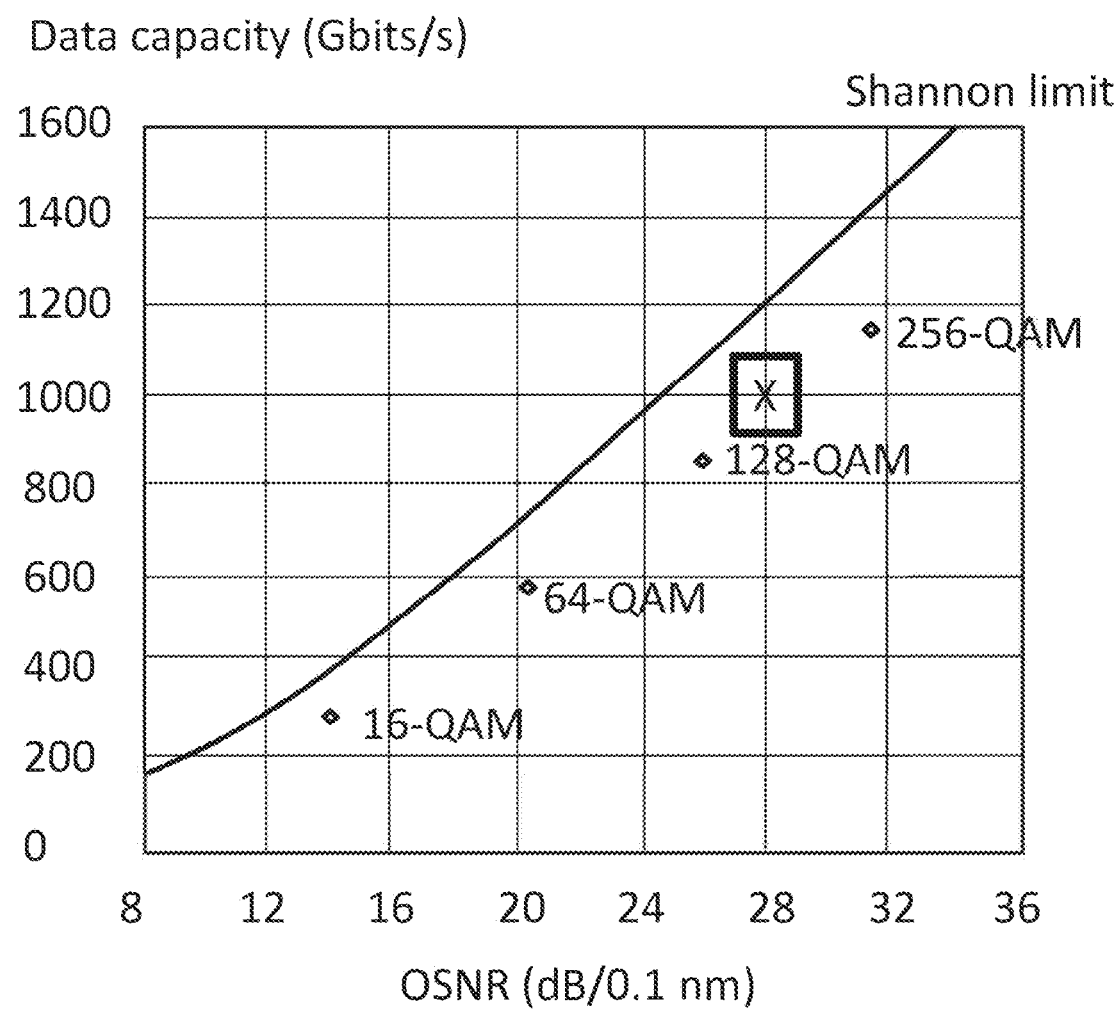
FIG. 2B is a diagram illustrating data capacity versus optical Signal-to-Noise Ratio (SNR) and the Shannon limit for a system with two polarizations and slightly less than 50 GHz channel bandwidth.

FIG. 2B is a diagram illustrating data capacity versus optical Signal-to-Noise Ratio (SNR) and the Shannon limit. The Shannon limit of a communication channel refers to the maximum rate of error-free data that can theoretically be transferred over the channel if the link is subject to random data transmission errors, for a particular noise level. FIG. 2B shows various QAM levels. So, for instance, if a data capacity of 1000 Gbit/s is needed then 128 QAM is insufficient and, without intermediary QAM levels, 256 QAM will be needed, considering 96 Gbaud per second as a line-rate including some redundancy for FEC.

Sometimes there exists a need to augment existing standards for communication systems with additional capabilities. For example, in digital transmission one may want to add to existing 64 QAM, 128 QAM and 256 QAM modes, for example.

There is therefore proposed a technique for enabling other levels of QAM, for example one that will enable a 1000 GHz data capacity, marked as X in FIG. 2B. This requires higher than 128 QAM but lower than 256 QAM, for instance 196 or 144 QAM.

Figure 3:
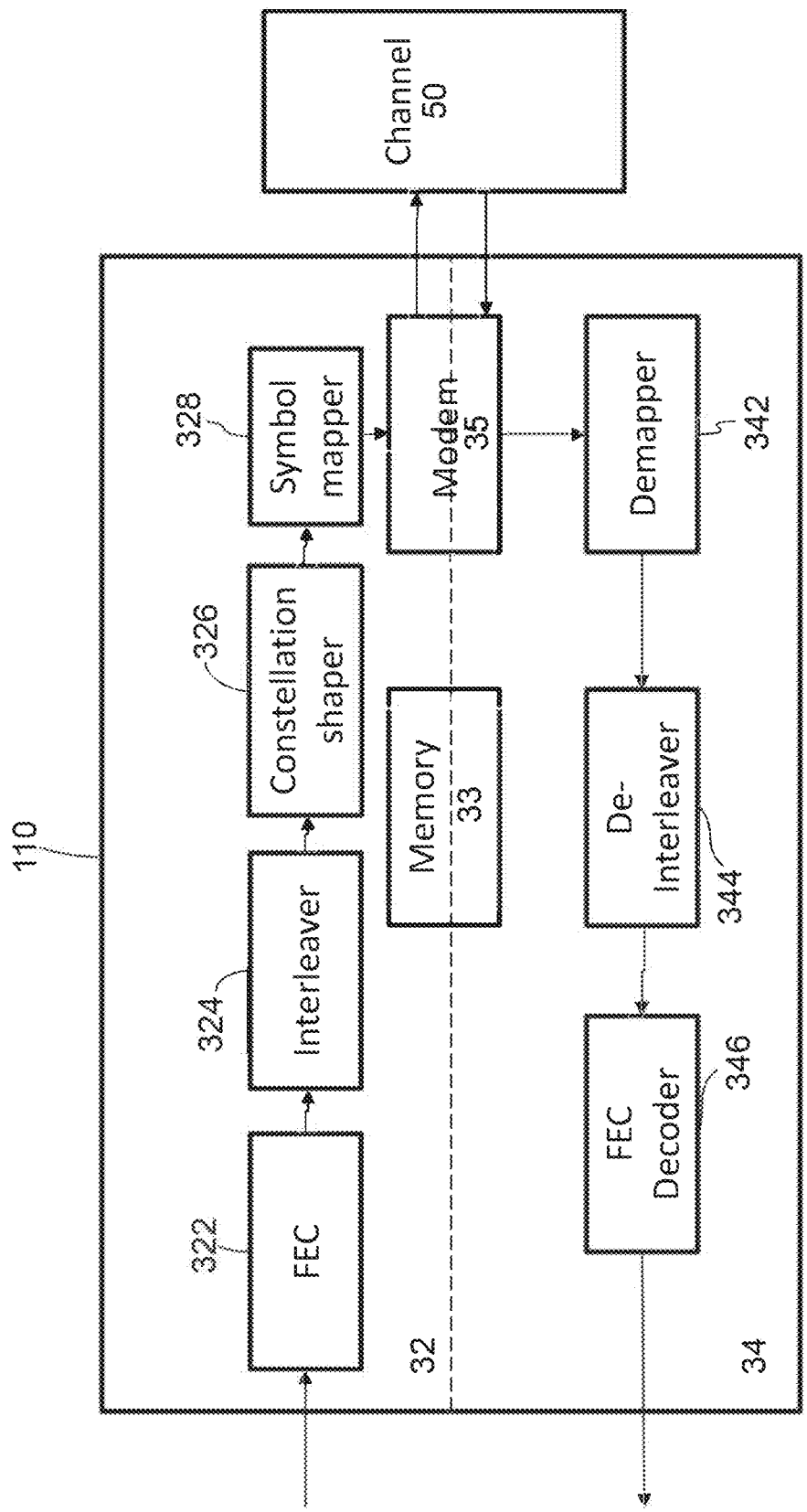
FIG. 3 is a block diagram illustrating examples of components of a transceiver device configured to perform the constellation shaping techniques presented herein.

FIG. 3 is a block diagram illustrating the components of the transceiver devices 110*a*-110*c*. As the name suggests, each transceiver device 110*a*-110*c* comprises a transmitter part 32 and a receiver part 34. A signal for transmission is encoded by the transmitter part 32 of a transceiver device e.g. transceiver device 110*a* and then transmitted from the transceiver device 110*a* via a transmission channel 50 to another transceiver device e.g. transceiver device 110*c*, where the received signal is decoded by the receiver part 34 of the receiving transceiver device 110*c*. Memory 33 is illustrated and any of the components of the transceiver device may access, write to or read from the memory 33 as required. A computer-readable medium may be provided comprising instructions which, when executed by a computer, cause the computer to carry out the method described herein. These instructions may be stored in memory 33. A modulator-demodulator unit (known as a modem) 35 modulates data to be transmitted prior to their transmission upon the transmission channel 50 and demodulates data received from the transmission channel 50. The modem 35 modulates and demodulates the symbols according to the modulation requirements of the transmission channel 50 (e.g. in frequency) and the modulated symbols are transmitted via transmission channel 50 to a receiver part 34 of another transceiver device.

Persons skilled in the art of signal modulation and demodulation will appreciate that the components illustrated in FIG. 3 are a subset of the components that are contained within a modem/transceiver device 110a-110c but a simplified version is illustrated for the ease of understanding the disclosure.

Turning firstly to the receiver part of a transceiver device, the receiver part 34 of a transceiver device comprises the demodulator part of modem 35, a demapper 342, a de-randomiser/de-interleaver 344 and a Forward Error Corrector (FEC) decoder 345. The demapper 342 receives the plurality of symbols that have been operated on by transmission channel 50 and demodulated by the modem 35 and decodes the plurality of symbols to produce a decoded output (according to the coding employed by a symbol mapper in the transmitter part 32 of the transmitting transceiver device). The output of demapper 342 is received by de-randomizer/de-interleaver 344, which de-randomizes and then de-interleaves the received data. The output of de-interleaver 344 is received by the FEC decoder 346, which performs FEC decoding upon the received data bits. FEC decoder 346 produces recovered information bits that correspond to the information bits transmitted by the transmitting transceiver device absent errors introduced by the transmission channel 50 and/or other components of the communication path.

This disclosure relates to the transmitter part of a transceiver device and so further discussion relating to the receiver part will not be provided.

Turning now to the transmitter part of a transceiver device, in an embodiment, the transmitter part 32 of a transceiver device comprises a FEC encoder 322, an interleaver/randomiser 324, a constellation shaper 326, a symbol mapper 328 and the modulator part of modem 35. The FEC encoder 322 receives information bits and codes the plurality of information bits to produce a plurality of FEC blocks. The FEC encoder 322 may, for instance, employ Reed-Solomon coding in concatenation with another type of FEC coding, such as trellis coding, convolutional coding, Turbo Coding, or another type of channel coding. Interleaver 324 receives the plurality of FEC blocks from FEC encoder 322, interleaves the FEC blocks and randomizes the FEC blocks to produce a plurality of interleaved and randomized FEC blocks.

Constellation shaper 326 receives the plurality of interleaved and randomized FEC blocks and operates on the plurality of interleaved and randomized FEC blocks to produce a plurality of binary labels BLs, as will be described further below.

A symbol mapper 328 receives the Binary Labels BLs and maps the bits of the binary labels BLs to modulation symbols. The symbol mapper 328 produces a plurality of modulation symbols that are received and modulated by the modem 35 and then transmitted via transmission channel 50 to a demapper 342 located in a receiver.

The constellation shaper 326 of FIG. 3 maps the received digital data sequence of the FEC frame to modulation symbols according to the present disclosure that will be described further with reference to FIGS. 4-9C. The symbol mapper 328 produces a sequence of modulation symbols that are input to modem 35. The modulation symbols produced by the symbol mapper 328 may be converted in frequency by modem 35 prior to their transmission upon the transmission channel 50. The modem 35 modulates the symbols according to the modulation requirements of the transmission channel 50 and the modulated symbols are transmitted via transmission channel 50 to a receiver part 34 of another transceiver device.

Figure 4:
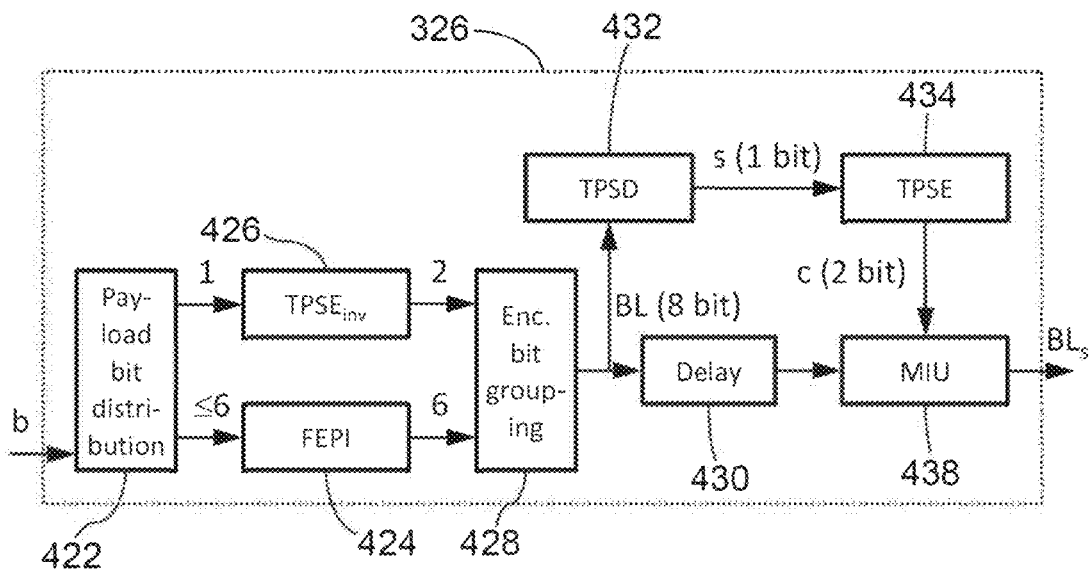
FIG. 4 is a block diagram of an embodiment of a constellation shaper module of the transceiver device shown in FIG. 3.

FIG. 4 is a block diagram of an embodiment of the constellation shaper 326 of FIG. 3, and may be a trellis-based probabilistic constellation shaper. The constellation shaper 326 in the transmitter part 32 receives a digital data sequence and applies a search procedure to the digital data sequence to determine the best sequence of symbols that represent the digital data sequence. This may be referred to as a shaping-bit sequence s, which represents an additional bit stream for giving the signal desired characteristics, such as usually minimum average power. The determination is performed at the transmitter by applying a search procedure to the BL representing a signal point sequence, the search procedure comprising using an algorithm/process, for instance the Viterbi decoding algorithm/process, to minimize average output symbol power.

Input to the constellation shaper 326 is a digital data sequence comprising blocks of bits b output by the interleaver/randomiser 324 and output from the constellation shaper 326 are shaped binary labels ($BL_s$) that are input to the symbol mapper 328, the Binary Label $BL_s$ representing a signal point sequence i.e. a sequence of symbols. Each block of input bits b is input to a Payload Bit Distribution unit 422. The majority of the block of input bits b are output from the Payload Bit Distribution unit 422 to FEPI 424, while for instance only one bit per block is output from Payload Bit Distribution unit 422 to a constellation shaper encoder ($TPSE_{inv}$) 426. FEPI 424 undertakes FEC encoding, puncturing, one-padding and interleaving on the majority of the block of input bits b and constellation shaper encoder 426 operates on the one bit, as will be discussed below.

Figure 5:
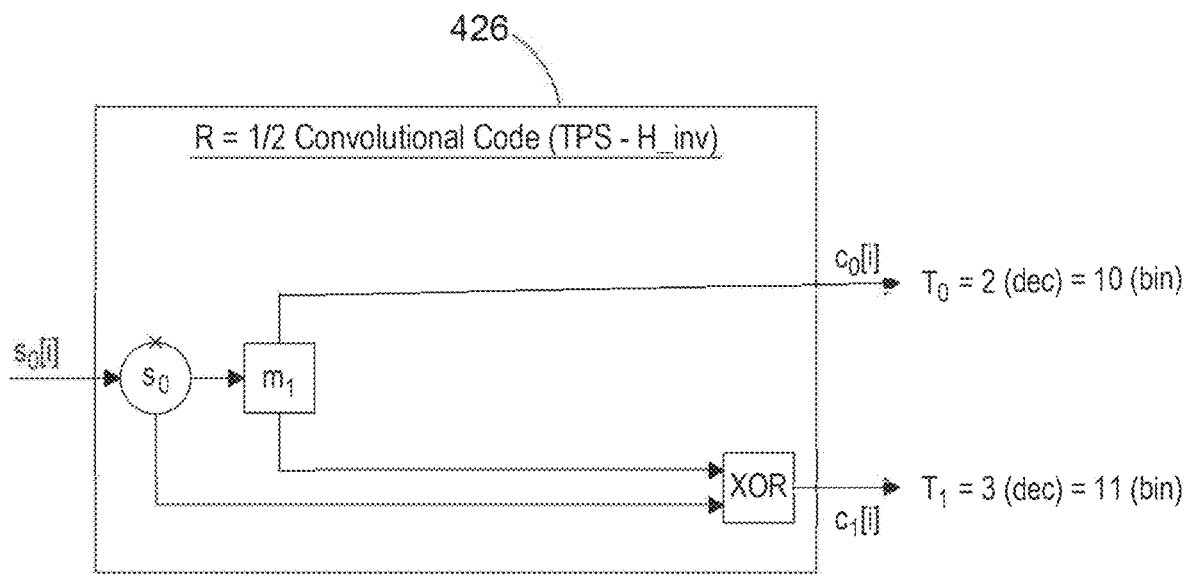
FIG. 5 illustrates an embodiment of the constellation shaper encoder that forms a part of the constellation shaper module of FIG. 4.

FIG. 5 illustrates an embodiment of the constellation shaper encoder ($TPSE_{inv}$) 426, which receives an input $s_0[i]$ from the Payload Bit Distribution unit 422 and outputs two outputs $c_0[i]$ and $c_1[i]$. The input $s_0[i]$ passes to a memory $m_1$ where it is buffered. On the next clock cycle, the bit is output as output $c_0[i]$. The input $s_0[i]$ is also input to an XOR block, the other input of which is from the memory $m_1$. XOR block therefore XORs the current input $s_0[i]$ with the previous input $s_0[i-1]$ to produce a second output $c_1[i]$. In the illustrated embodiment, the constraint length is 2 (i.e., the memory $m_1$ has a size of 1 bit). Input and output signals are binary logical values. The "doubled" output of $c_0[i]$ and $c_1[i]$ from constellation shaper encoder 426 provides ½ rate convolution encoding.

Returning to FIG. 4, the outputs from FEPI 424 and constellation shaper encoder $TPSE_{inv}$ 426 are input to Encoded-Bit Grouping unit 428 that groups the resulting bits into 8-bit (raw) binary labels (BL), each associated with a QAM symbol. The resulting raw BL sequence is input to a delay buffer 430 and also input to a trellis based probabilistic constellation shaping decoder (TPSD) 432 which minimizes average output symbol power by determining the best shaping-bit sequence s. The output s from TPSD 432 indicates the modulation symbol determined to be the best fit for the BL sequence input to the TPSD 432. The determination is performed by applying a search procedure to the BL, e.g., a search procedure of the Viterbi algorithm type, as will be described further below. The output s of the TPSD 432 is re-encoded by trellis based probabilistic constellation shaping encoder (TPSE) 434 into an inversion bit-pair sequence c. This is input to a Most Significant Bits (MSB) Inversion Unit (MIU) 436 to correct by inversion the two MSB of the delayed raw BL output by the delay buffer 430. The generator polynomial for $TPSE_{inv}$ is the inverse syndrome former being usually different from the mutually matching generator polynomials in TPSD and TPSE.

FIG. 4 shows that FEC encoding carried out by FEPI 424 and constellation shaper encoding carried out by constellation shaper encoder 426 are functionally separate components of the transmitter part 32. To reduce latency and the amount of data buffering they can be performed simultaneously, i.e. in parallel. In one embodiment, their output bits are then collected into binary-label (BL) groups of 8 bit associated with a 256 QAM base constellation, which is going to be used for all symbol mappings. The raw BL stream is processed by Viterbi-based trellis-shaped probabilistic constellation shaping decoder TPSD 432, which determines the optimum shaping-bit sequence s. This is input to TPSE 434, which then yields the optimum MSB inversion sequence c. Since decoding and re-encoding involves a delay, the raw BL stream is buffered in a delay line, before it meets c for MSB inversion in MIU. The output of MIU is the shaped BL, which is used for the final average-power optimised mapping to QAM.

Figure 6:
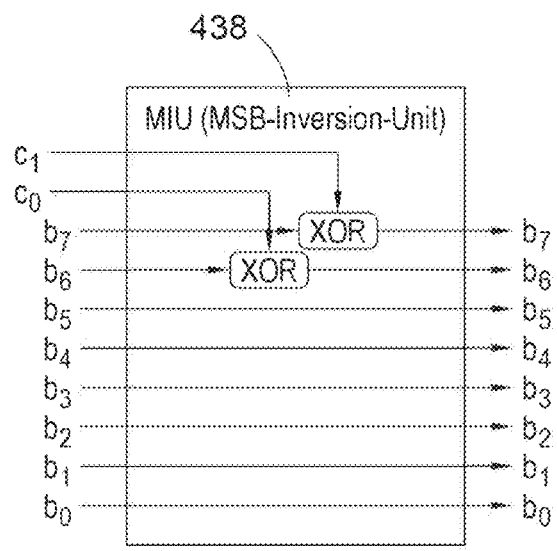
FIG. 6 shows an example of a Most Significant Bits (MSB) Inversion Unit (MIU) that forms a part of the constellation shaper module of FIG. 4.

FIG. 6 shows the internal operation of the MIU 438 of FIG. 4. MSB Inversion Unit (MIU) conditionally flips the two MSBs of binary label (BL)=(b7, ..., b0) according to the bit sequence c=(c1, c0) output by constellation shaper $TPSE_{inv}$ 426. MSBs of BL are input to XOR operation within the MIU that performs an inversion conditioned on the re-encoded shaping sequence.

As mentioned above, the TPSD 432 minimizes average output symbol power by determining the best shaping-bit sequence s for the 8-bit Binary Labels input to the TPSD 432. The determination is performed by applying a search procedure to the BL, e.g., a search procedure of the Viterbi algorithm type. A Viterbi decoder uses the Viterbi decoding algorithm for decoding a bitstream that has been encoded using a convolutional code or trellis code. A Viterbi decoder for basic (not punctured) code usually consists of the following major blocks: Branch metric unit (BMU); Path metric unit (PMU); Traceback unit (TBU). A branch metric unit's function is to calculate branch metrics, which are typically normed distances between every possible symbol in the code alphabet, and the received symbol. For instance, the branch metrics may be the sum power of symbol sequence to minimize the average transmit signal power. A path metric unit PMU iteratively processes branch metrics to get metrics for $2^{K-1}$ paths conditional on the preceding data stream, where K is the constraint length of the code, one of which can eventually be chosen as optimal. Every clock cycle the TPSD 432 typically makes $2^{K-1}$ decisions, discarding non-optimal paths. The results of these decisions are written to the memory of a traceback unit. The core elements of a PMU are ACS (Add-Compare-Select) units. The way in which they are connected between themselves is defined by a specific code's trellis diagram. The PMU aggregates and orchestrates the ACS units, which are the "heart" of the decoder. The Viterbi algorithm involves the orchestration of many ACS steps and the decoding process comprises a sequence of ACS operations.

Figure 7:
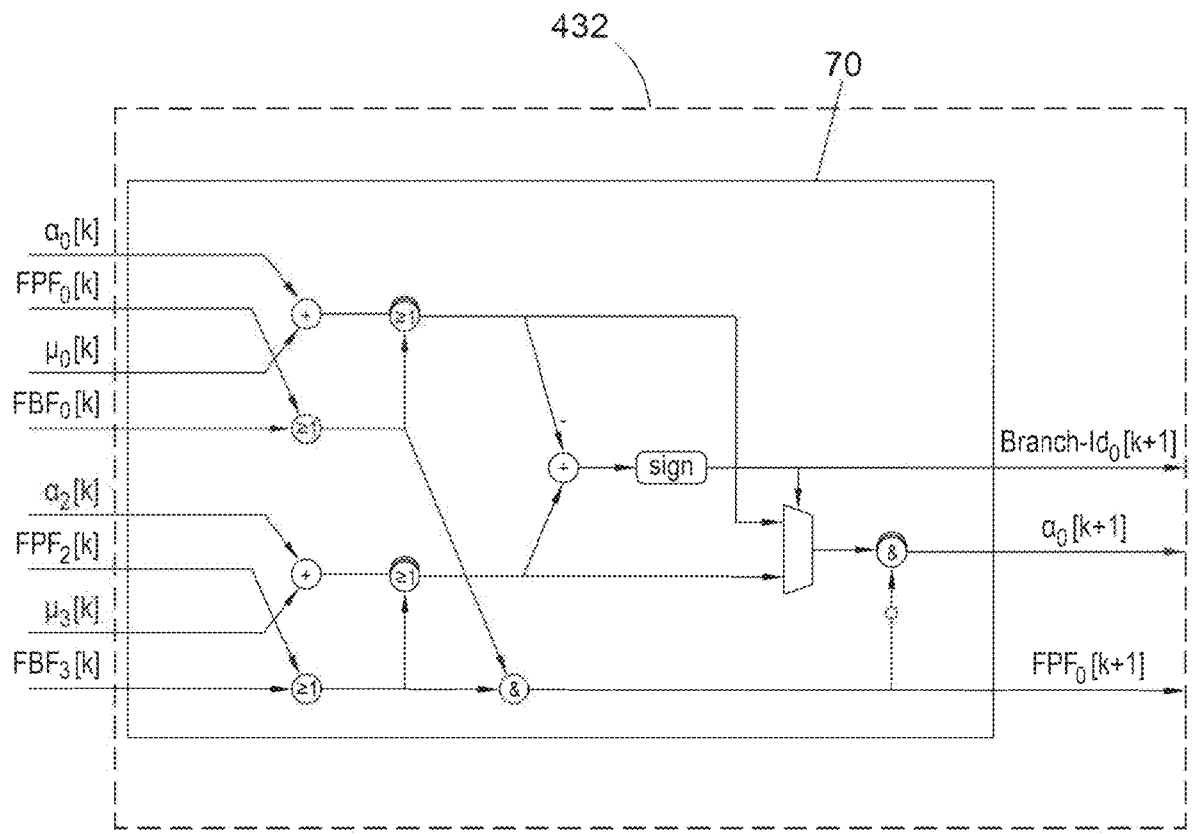
FIG. 7 shows an embodiment of add-compare-select (ACS) module within a decoder that forms a part of the constellation shaper module of FIG. 4.

FIG. 7 shows an embodiment of add-compare-select (ACS) modules 70 within the TPSD 432. The TPSD 432 in practice may include a plurality of ACS modules 70, operating in parallel. In FIG. 7 the logical-AND operation is denoted by (&) and the logical-OR operation by (≥1). Inputs to the ACS are unsigned (US) integer path metrics α and unsigned integer branch metrics μ and output from the ACS is a branch decision Branch-Id. Also input are additional binary logical input signals for forbidden-branch flag (FBF) and forbidden-path flag (FPF). These additional inputs are processed together with the unsigned integer path metrics α and unsigned integer branch metrics μ to yield additional outputs FPF and updated unsigned integer path metrics α. For the metric inputs, OR results in forcing the value to maximum metric when true, and results in forcing the value to 0 when false. One (unsigned) metric α or μ is paired with one binary flag. This yields novel path information (α, FPF) and the novel branch information (μ, FBF).

The FPF and path metrics a come from previous ACS steps in the trellis and are input to the next ACS in the next trellis step, usually via the so-called path metric memory or registers. The FPF and μ comes from the signal constellation information. μ corresponds to the energy (power) of the signal point and FBF indicates that the signal point is not allowed.

This is exemplified in the following C++ code, which implements an embodiment of a TPSD-internal processing core detailing one ACS operation with generic data type and how ACS is operated in a loop to cover an entire trellis step. In a preferred embodiment, ACS are implemented in parallel hardware instances and in time-scheduled operations. ACS data flow of this software implementation may be according to the fixed-point binary embodiment shown in FIG. 7.

```
//! Connectivity information on a trellis branch (bT = int, uint16_t, uint8_t)
template<typename bT>
struct branch_t
{
    bT fromState; //!< Index 0,...,nStates-1 of originating state
    bT inBits;    //!< Input-bit tuple 0,...,nBranchesPerState-1 (i.e. input-bit pattern)
    bT outBits;   //!< Output-bit tuple 0,...,nBranchTypes-1, i.e. index of branch type
}; // branch _t
//! Compound information on a trellis-related metric (T = int, unsigned, uint16_t,float, double)
with forbidden flags
template<typename T>
struct metr_t
{
```

```
        T metric; //!< Metric value
        bool forbidden; //!< Forbidden when true, allowed when false
        //! Maximum numerical value for generic metric type T
        static constexpr T metricMax = std::numeric_limits<T>::max( ); // C would hard-code e.g. INT_MAX
        //! Add-compare-select for one new path metric and decision for branch taken on that path
/*!
Computes the new path metric from the previous path metrics α and branch metrics µ according
to trellis-branch information.
        \return
Branch index associated with decided path. The decision for the input-bit tuple can then be
obtained by BranchInfo[iBranchDecision].inBits when needed.
*/
        template<typename bT>
        int acs(
                const metr_t* const path, //!< [in] Array with previous      metrics for states 0,...,nStates-1
                const metr_t* const branch, //!< [in] Array with metrics for branches 0,...,nBranchTypes-1
                const branch_t<bT>* const branchInfo, //!< [in] Array with info for branches 0,..., nBranchesPerState-1
                const int nBranchesPerState //!< [in] Number of branches per state
        )
        {
        forbidden = true;
        metric = metricMax;
        int iBranchDecision = 0;
        for ( int iBranch = 0; iBranch < nBranchesPerState; iBranch++ )
        {
                const branch_t+21bT>bi = branchInfo[iBranch];
                if ( !path[bi.fromState].forbidden && !branch[bi.outBits]forbidden )
                {
                        forbidden = false;
                        const T metricCandidate = path[bi.fromState].metric + branch[bi.outBits].metric;
                        if ( metricCandidate < metric)
                        {
                                metric = metricCandidate;
                                iBranchDecision = iBranch;
                        }
                }
        }
        if ( forbidden ) metric = 0;
        return iBranchDecision;
}
//! Do all ACS processing associated with one trellis step
template<typename bT, typename tbT>
static T trellisStep(
        const metr_t* const pathPrev, //!< [in] Array with previous metrics for states 0,...,nStates-1
        metr_t* const pathNext, //!< [out] Array with next metrics for states 0,...,nStates-1
        tbT* const traceBack, //!< [out] Array with decided branch index to previous state for states 0,...,nStates-1
        const metr_t* const branch, //!< [in] Array with metrics for branches 0,...,nBranchTypes-1
        const branch_t<bT>* const branchInfo, //!< [in] Array with info for branches 0,...,nStates*nBranchesPerState-1
        const int nBranchesPerState, //!< [in] Number of branches per state
        const int nStates //!< [in] Number of states
)
{
        T minMinACS = metricMax;
        for ( int j = 0; j < nStates; j++ )
        {
                traceBack[j] = (tbT)pathNext[j].acs( pathPrev, branch, branchInfo + j*nBranchesPerState, nBranchesPerState );
                minMinACS = std::min( minMinACS, pathNext[j].metric );
        }
        return minMinACS;
}
}; // metr_t
```

"trellisStep" above provides an example of how ACS modules 70 obtain their input via memory from a previous step and how they store their output for the ACS in the next trellis step.

The forbidden-branch flags (FBF) apply a quasi-infinite weighting to a branch within the Viterbi algorithm and in effect make a branch within the trellis forbidden to the Viterbi algorithm. This means that the Viterbi algorithm is denied access to certain branches in the trellis and hence to certain symbols.

The forbidden-branch flags are determined based on the QAM level to be implemented. For instance, if the QAM level to be implemented is a $2^{2n}$ QAM matrix (such as 16 QAM, 64 QAM, 256 QAM), no forbidden-branch flags are set in a constellation based on the $2^{2n}$ QAM. For example, if 256 QAM is to be implemented, no forbidden-branch flags are set in a constellation based on 256 QAM. However the QAM level to be implemented may be one that is not a $2^{2n}$ QAM matrix (such as 100 QAM, 144 QAM, 196 QAM etc.). In these cases, forbidden-branch flags are set for (QAM1-QAM2) points in the QAM1 trellis, where QAM1 is the level of the $2^{2n}$ QAM constellation on which a reduced QAM2 level constellation is to be based. For example, when 144 QAM is to be implemented based on a 256 QAM constellation, then forbidden-branch flags are set (e.g. to TRUE) for QAM1-QAM2 (256–144) 122 points in the trellis. The forbidden-branch flags FBF are programmed into the transceiver according to the intended operation of the transmit part of the transceiver device.

The forbidden-path flags (FPF) are learnt as the Viterbi algorithm operates on the incoming data.

By introducing a so-called forbidden-branch flag (FBF) and a forbidden path flag (FPF), and by modification of an add-compare-select operation of ACS modules 70, the internal Viterbi algorithm of the TPSD 432 will generate a shaped constellation within the specified constellation limits (e.g. 144 QAM). The Viterbi path metrics correspond to the so-far emitted total signal power, while the branch metrics correspond to the instantaneous signal power. It is clear that minimizing the total emitted power for a given fixed number of QAM symbols also minimises the average signal power. FIG. 7 shows one way in which the metrics inside ACS may be processed and generated, but the disclosure is intended to also cover equivalent or similar ways of processing. The branch-dependent FBF input can either be obtained from a Look up table (LUT) in memory 33 or some suitable logic.

The proposed method with forbidden paths finds particular application when the shaped constellation size shall be confined to a certain non-power-of-two cardinality, e.g. 144 QAM, 196 QAM etc., i.e. a subset of points from a square (e.g. 256) QAM base constellation. The proposed Viterbi algorithm determines which symbols are forbidden and computes path metrics accordingly without the need for very high but finite penalty weights, which may not always work. The method also works reliably for additional confinement when the base constellation is non-square. In optical systems, the two polarizations can be treated independently or jointly.

Figure 8:
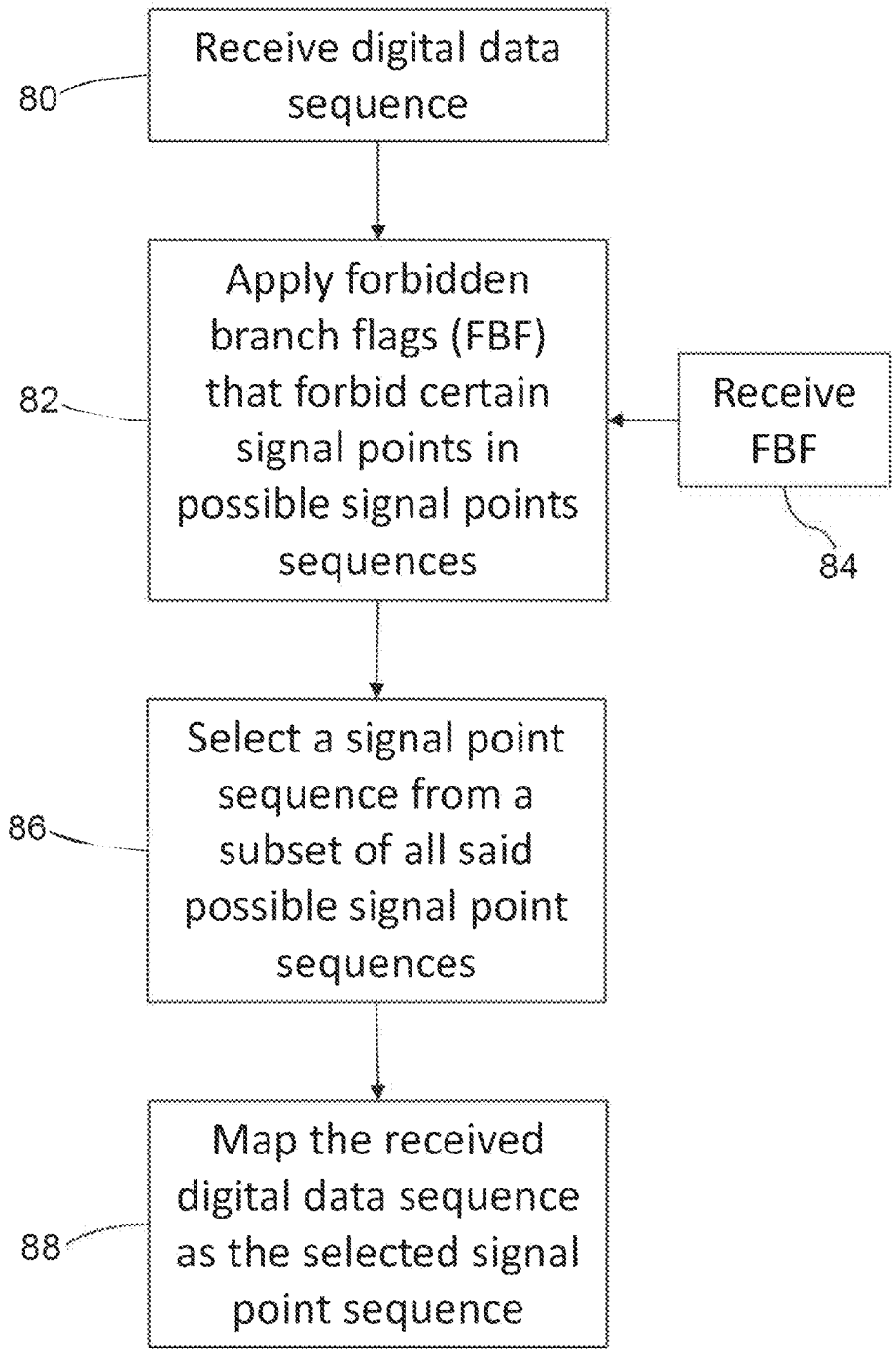
FIG. 8 is a flow chart illustrating a method of constellation shaping.

FIG. 8 shows a flow chart illustrating an embodiment of this technique. The method is carried out by a transceiver for transmitting and receiving data sequences via a channel. The transceiver comprises a transmitter configured to map a digital data sequence into a signal point sequence for transmission, the signal point sequence belonging to a set of possible signal point sequences. The transmitter receives the digital data sequence to be transmitted and maps this digital data into a signal point sequence for transmission. This mapping may comprise a sequence of symbols from a constellation of possible symbols.

As shown in FIG. 8, the transmitter receives the digital data sequence to be transmitted (operation 80). The transmitter then applies forbidden branch flags (FBF) (operation 82) that forbid certain signal points in said possible signal points sequences. The forbidden branch flags (FBF) may be received (operation 84) from memory 33, where the FBF may be stored as Look Up Tables (LUT). The forbidden branch flags may be programmable and stored in memory associated with the transmitter. The FBF flag some of the symbols from a constellation of possible symbols as forbidden and thus excluded from the possible signal point sequences.

The transmitter then selects (operation 86) a signal point sequence from a subset of all said possible signal point sequences based on the digital data sequence, the subset being defined by the forbidden branch flags.

The transmitter then maps the received digital data sequence as the selected signal point sequence (i.e. symbol sequence) (operation 88) and the symbol sequence is then received and modulated by the modem 35 and then transmitted via transmission channel 50.

The forbidden branch flags, for instance, forbid certain signal points in a trellis code. This may be accomplished by the forbidden branch flags applying a maximum or quasi-infinite weighting to certain signal points in the set of possible sequences of signal points.

The transmitter may comprise a Viterbi decoder configured to select said signal point sequence, wherein the forbidden branch flags apply a maximum or quasi-infinite weighting to certain signal points in the set of possible signal points processed by the Viterbi decoder. The Viterbi decoder of the transmitter may be configured to learn forbidden paths resulting from the forbidden branch flags applying a maximum or quasi-infinite weighting to certain signal points in the set of possible sequences of signal points.

The set of possible sequences of signal points for instance correspond to a QAM constellation and the forbidden branch flags correspond to signal points in the QAM constellation. In particular, the QAM constellation may be a M-level QAM constellation, where $M=2^{2n}$, where n in an integer equal or greater to 1, and the forbidden branch flags define a reduced-level QAM constellation, where the level of the reduced-level QAM is less than M. For example, the QAM constellation may be a 256 QAM constellation and the forbidden branch flags define a reduced-level QAM constellation such as a 144 QAM constellation or 196 QAM constellation.

Figure 9A:
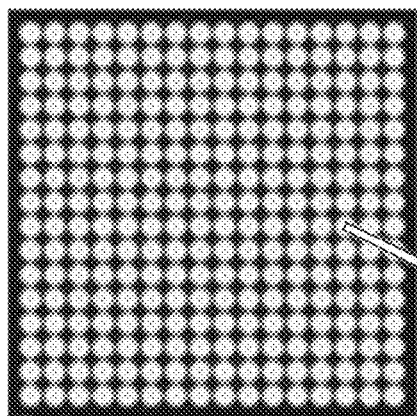
FIGS. 9A, 9B and 9C show examples of the constellation shaping applied to a 256 QAM constellation.
Figure 9B:
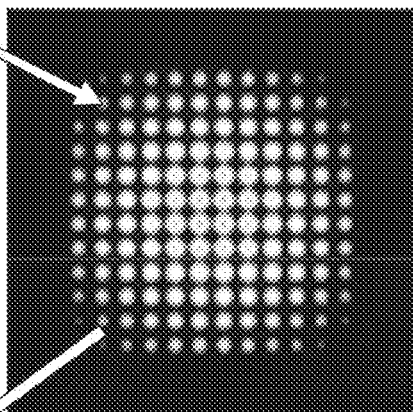
Figure 9C:
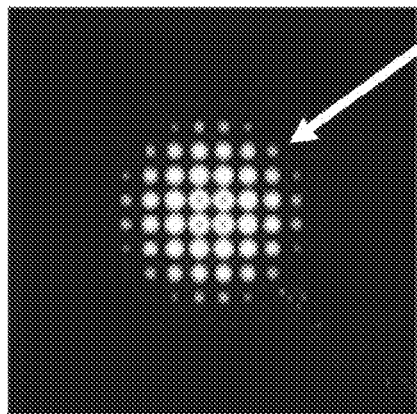

For instance, FIGS. 9A-9C show an example of the constellation shaping applied to a 256 QAM constellation. FIG. 9A shows a square 256 QAM constellation. Consider that 144 QAM is desired (to enable a data capacity of 1000 Gbit/s, as shown in FIG. 2B). When 144 QAM is to be implemented, then forbidden-branch flags are set (for example to TRUE) for (256–144) 122 points in the trellis. These represent the symbols that are around the perimeter of the constellation (being the less probable symbols). FIG. 9B shows the constellation shaped to 144 symbols, with branches to the symbols blacked out being forbidden by means of the forbidden branch flags stored in memory of the constellation shaper 326.

The 256 QAM constellation may be further reduced to say 100 QAM by changing the forbidden branch flags stored in memory of the constellation shaper 326 so that (256–100) 156 branches are forbidden. FIG. 9C shows the 256 square constellation shaped to 100 symbols, with branches to the symbols blacked out being forbidden by means of the forbidden branch flags stored in memory of the constellation shaper 326.

The rate at the input of the constellation shaper 326 may be flexible and may be adjusted for channel quality. For simplicity, the output rate of the constellation shaper 326 towards the symbol mapper 328 may be constant, but it is not intended that this disclosure be limited to that case. Adaptive constellation mapping may also be used, allowing the forbidden branch flags to be updated as needed.

The forbidden branch flags apply a quasi-infinite weighting to a branch (and hence symbol) so that the Viterbi algorithm does not process that branch. Owing to the forbidden branch flags, the proposed Viterbi algorithm determines which symbols are forbidden and computes path metrics accordingly without the need for penalty weights, which may not always work. The method also works reliably for additional confinement when the base constellation is non-square. This technique does not require the processor-resource intensive calculation of weights for branches of the Viterbi algorithm but from the outset determines which branches are forbidden and excluded from computation. The forbidden flags change the behavior of the Viterbi algorithm at run-time by not allowing certain transitions when working with unusual QAM levels (for example 128 or 144 QAM). This results in a less dense trellis in some time steps.

The technique disables the use of some signal points from a very large probabilistically shaped constellation, rather than having to use huge heuristic penalizing weights to restrict a constellation, which requires large bit width for branch and state metrics in a fixed-point implementation. This could lead to prohibitive gate count for enabling the arithmetic and large silicon area for memory or registers. In this way, the forbidden flags are a resource-saving method to convey the restrictions.

In the proposed Viterbi algorithm with a "forbidden flag" for certain paths and branches, the trellis step consists of many ACS operations (as embodied by ACS module 70), which may either be performed simultaneously in parallel hardware, or sequentially, or any sensible mixture of to meet throughput and silicon-area requirements.

In one embodiment, a block b containing R×640 payload bits is input to the constellation shaper 326 of transmitter part 32 and 8×640 bit labels (BL) are output to symbol mapper 328 for mapping onto a sequence of 256 QAM symbols. The information rate R is adjustable in certain steps.

Although the disclosure has been described in relation to a 256 QAM base constellation, it is intended that other numerology shall also be covered by this disclosure. For instance, the base constellation may be a 128 QAM base constellation, a 512 QAM base constellation, a 1024 QAM base constellation and so on, with the forbidden branch flags excluding branches from consideration according to the QAM level to be implemented.

The technique disclosed herein may be used to augment existing standards for communication systems with additional capabilities. For example, in digital transmission the technique disclosed herein may be used to augment existing modes of QAM (such as 64 QAM, 128 QAM and 256 QAM modes) with other QAM modes, such as 144 QAM, 196 QAM as well as others.

The technique disclosed herein is susceptible to various modifications and alternative forms. Specific embodiments therefore have been shown by way of example in the drawings and detailed description. It should be understood, however, that the drawings and detailed description thereto are not intended to limit protection to the particular form disclosed, but on the contrary, the intention is to cover all modifications, equivalents and alternatives falling within the scope of the present invention as defined by the claims.

What is claimed is:

1. An apparatus for transmitting digital data sequences via a channel, the apparatus comprising:
a transmitter configured to map a digital data sequence into a signal point sequence for transmission, said signal point sequence belonging to a set of possible signal point sequences, the transmitter being configured to:
obtain said digital data sequence;
apply forbidden branch flags that forbid certain signal points in said set of possible signal point sequences; and
select said signal point sequence from a subset of said set of possible signal point sequences based on said digital data sequence, said subset being defined by said forbidden branch flags.

2. The apparatus of claim 1, wherein the forbidden branch flags forbid the certain signal points in a trellis code.

3. The apparatus of claim 1, wherein the forbidden branch flags apply a maximum weighting to the certain signal points in the set of possible signal point sequences.

4. The apparatus of claim 1, wherein the transmitter comprises a Viterbi decoder configured to select said signal point sequence, wherein the forbidden branch flags correspond to a maximum weighting applied to the certain signal points in the set of possible signal point sequences processed by the Viterbi decoder.

5. The apparatus of claim 4, wherein the Viterbi decoder of the transmitter is configured to learn forbidden paths resulting from the forbidden branch flags applying the maximum weighting to the certain signal points in the set of possible signal point sequences.

6. The apparatus of claim 4, wherein the maximum weighting is a quasi-infinite weighting.

7. The apparatus of claim 1, wherein the forbidden branch flags are stored in memory associated with the transmitter.

8. The apparatus of claim 7, wherein the forbidden branch flags are programmable.

9. The apparatus of claim 1, wherein the set of possible signal point sequences correspond to a Quadrature Amplitude Modulation (QAM) constellation and the forbidden branch flags correspond to signal points in the QAM constellation, wherein the QAM constellation is an M-level QAM constellation, wherein $M=2^{2n}$, wherein n is an integer equal or greater to 2, and the forbidden branch flags define a QAM constellation with a reduced level less than M, and wherein the QAM constellation is a 256 QAM constellation and the forbidden branch flags define a 144 or 196 QAM constellation.

10. A method for mapping a digital data sequence into a signal point sequence for transmission, said signal point sequence belonging to a set of possible signal point sequences, the method comprising:
obtaining said digital data sequence;
applying forbidden branch flags that forbid certain signal points in said set of possible signal point sequences; and
selecting said signal point sequence from a subset of said set of possible signal point sequences based on said digital data sequence, said subset being defined by said forbidden branch flags.

11. The method of claim 10, wherein the forbidden branch flags forbid the certain signal points in a trellis code.

12. The method of claim 10, further comprising applying a maximum weighting to the certain signal points in the set of possible signal point sequences indicated by the forbidden branch flags.

13. The method of claim 10, further comprising using a Viterbi decoding process to select said signal point sequence, wherein the forbidden branch flags correspond to a maximum weighting applied to the certain signal points in the set of possible signal point sequences processed by the Viterbi decoding process.

14. The method of claim 13, wherein the Viterbi decoding process learns forbidden paths resulting from the forbidden branch flags applying the maximum weighting to the certain signal points in the set of possible signal point sequences.

15. The method of claim 13, wherein the maximum weighting is a quasi-infinite weighting.

16. The method of claim 10, further comprising storing the forbidden branch flags in memory.

17. The method of claim 16, further comprising programming the forbidden branch flags.

18. The method of claim 10, wherein the set of possible signal point sequences correspond to a Quadrature Amplitude Modulation (QAM) constellation and the forbidden branch flags correspond to signal points in the QAM constellation, wherein the QAM constellation is a M-level QAM constellation, wherein $M=2^{2n}$, wherein n is an integer equal or greater to 1, and the forbidden branch flags define a QAM constellation with a reduced level less than M, and wherein the QAM constellation is a 256 QAM constellation and the forbidden branch flags define a 144 or 196 QAM constellation.

19. A non-transitory computer-readable medium comprising instructions for mapping a digital data sequence into a signal point sequence for transmission, said signal point sequence belonging to a set of possible signal point sequences, wherein the instructions, when executed by a computer, cause the computer to:

receive said digital data sequence;

apply forbidden branch flags that forbid certain signal points in said set of possible signal point sequences; and select said signal point sequence from a subset of said set of possible signal point sequences based on said digital data sequence, said subset being defined by said forbidden branch flags.

20. The non-transitory computer-readable medium of claim 19, wherein the forbidden branch flags forbid the certain signal points in a trellis code.

* * * * *